United States Patent [19]

Boudreau

[11] Patent Number: 4,715,940

[45] Date of Patent: Dec. 29, 1987

[54] MASK FOR PATTERNING ELECTRODE STRUCTURES IN THIN FILM EL DEVICES

[75] Inventor: Robert A. Boudreau, Hampton, N.H.

[73] Assignee: GTE Products Corporation, Danvers, Mass.

[21] Appl. No.: 790,590

[22] Filed: Oct. 23, 1985

[51] Int. Cl.[4] ............................................. C23C 14/00
[52] U.S. Cl. .................................. 204/192.1; 51/301; 118/504; 118/505; 156/654; 204/192.12; 204/192.29; 204/298; 427/99; 427/248.1; 427/250; 427/252; 427/272; 427/282
[58] Field of Search ................ 118/504, 505; 204/298, 204/192 R, 192.1, 192.12; 427/248.1, 250, 252, 272, 282, 99; 51/301; 156/654

[56] References Cited

U.S. PATENT DOCUMENTS

| | | | |
|---|---|---|---|
| 3,510,349 | 5/1970 | Jones | 117/212 |
| 4,049,857 | 9/1977 | Hammer | 204/298 |
| 4,188,247 | 2/1980 | Ridgeway | 51/310 |
| 4,273,812 | 6/1981 | Tsutsui et al. | 427/248.1 |
| 4,322,277 | 3/1982 | Opresko | 204/298 |
| 4,335,161 | 6/1982 | Luo | 427/86 |
| 4,344,988 | 8/1982 | Sono et al. | 427/248.1 |
| 4,391,034 | 7/1983 | Stuby | 204/298 |
| 4,437,966 | 3/1984 | Hope et al. | 204/298 |
| 4,511,599 | 4/1985 | Rustomji | 427/282 |

OTHER PUBLICATIONS

Tannas et al., SID 82, Digest 123.
Ingle, Rev. Sci. Inst., 45 (1974) pp. 1460-1461.

*Primary Examiner*—Arthur P. Demers
*Attorney, Agent, or Firm*—Martha Ann Finnegan; José W. Jimenez

[57] ABSTRACT

A shadow mask is provided which can provide a precise patterning to a deposit at process temperature without destruction of the shadow mask itself. The shadow mask consists of a plurality of metallic strips having a series of interconnecting small arched bridges that hold the strips of the mask together. The shadow mask is used in a process for depositing electrode structures in an electroluminescent device wherein the mask is positioned over a substrate surface to be coated and deposit electrode material is sprayed from a geometrically broad source, through the mask and onto the substrate. Deposition occurs beneath the arched bridges resulting in a pattern deposition that does not readily reveal the presence of bridges because sufficient material is coated beneath to provide cosmetic and electrical continuity between areas separated by the bridges. This invention is particularly suited for a mask designed to provide a fine pattern of closely spaced parallel lines or electrode structures.

30 Claims, 10 Drawing Figures

MASK FOR PATTERNING ELECTRODE STRUCTURES IN THIN FILM EL DEVICES

CROSS REFERENCE TO CO-PENDING APPLICATIONS

In copending Application filed under Ser. No. 790,695 File 10-23-85 ("Mechanism for Automatic Precise Registration of Shadow Masked EL Electrode Patterns". Boudreau et al), there is defined a mechanism that allows for remote controlled total automatic registration of shadow masks to a substrate while being operated in an in-line deposition system.

In copending Application filed under Ser. No. 790,589 File date 10-23-85 ("Mask Assembly Having Mask Stress Relieving Feature," Robert Boudreau), there is defined a mask assembly that provides support for a shadow mask while eliminating mask wrinkling during patterning of thin film structures.

Both of the above Applications are filed concurrently herewith and are assigned to the same assignee as the instant invention.

TECHNICAL FIELD

The present invention relates in general to thin film EL display panels and particularly to a mask and its use in the fabrication of electrode structures for a thin film EL device.

BACKGROUND OF THE INVENTION

Thin film electroluminescent (EL) display panels have been known to be very useful for displaying information in as much as the thin film structure including the cross electrodes can be deposited on a glass substrate thereby providing a matrix display panel capable of being selectively energized to activate individual pixels thereon. One of the problems in the past in the development of EL panels has been developing a high degree resolution (i.e., a high number of electrodes per linear inch), without creating shorts between electrodes after deposition.

Most thin film EL devices have had their electrodes patterned by a wet process known as photolithography. The photolithographic method has been a very attractive method due to its cost effective fabrication of large area circuits containing a high density of components. Photolithography is very similar to processes used to develop photographs in that the deposit to be patterned is coated with light sensitive material, which is then exposed to a negative or positive pattern and then developed and later stripped in various corrosive developing solutions. The disdvantages of this method is that it is slow and labor intensive and involves many steps, each one subject to failure or possible contamination of the thin film device. Additionally, the thin film EL devices are very sensitive to moisture and many of the solutions are aqueous in nature. Furthermore, photolithography produces electrode patterns with sharp edges that have been shown to promote electrical breakdown of the thin film EL devices. A method which would produce a rounding of the electrode structure edge would help to prevent this and would be considered a significant advancement in the electrode structure deposition art.

It is also believed that an apparatus that would assist in the deposition of thin film electrode structures while promoting simplicity and manufacturing ease would constitute a significant advancement in the art.

DISCLOSURE OF THE INVENTION

It is, therefore, a primary object of this invention to enhance the art of thin film structures deposition and particularly that art involving thin film electroluminescent panels.

It is another object of this invention to provide a mask for patterning thin film structures in thin film devices, particularly electrode structures in EL panels.

Still another object of the invention is to provide a method of depositing a pattern of electrode structures for a thin film EL device having at least a substrate, wherein said method involves the use of a mask.

In accordance with one aspect of this invention, there is provided a mask for the patterning of electrode structures for a thin film device having at least a substrate. The mask comprises a plurality of metallic strips which extend across the mask, and are substantially parallel to each other, and a series of metallic interconnecting bridges which extend across the mask and are perpendicular to the strips. The bridges are in contact with the strips and along with the strips define a predetermined pattern of elongated apertures.

In accordance with another aspect of this invention, there is provided a method of depositing a pattern of electrode structures for a thin film device having at least a substrate. The method comprises the steps of providing a mask having a plurality of metallic strips which extend across the mask that are substantially parallel to each other and a series of metallic interconnecting bridges which extend across the mask that are perpendicular to the strips. The bridges are in contact with the strips and along with the strips define a predetermined pattern of elongated apertures. The method also includes the steps of positioning the mask on one side of the substrate and positioning a magnet adjacent the side of substrate opposite the mask such that the metallic strips are held in operative contact with the substrate. The method further includes vacuum depositing electrode material through the apertures of the mask, thereby forming the electrode structures on the substrate.

BEST MODE FOR CARRYING OUT THE INVENTION

For a better understanding of the present invention, together with other and further objects, advantages and capabilities thereof, reference is made to the following disclosure and appended claims in connection with the above described drawings.

Figure 1:
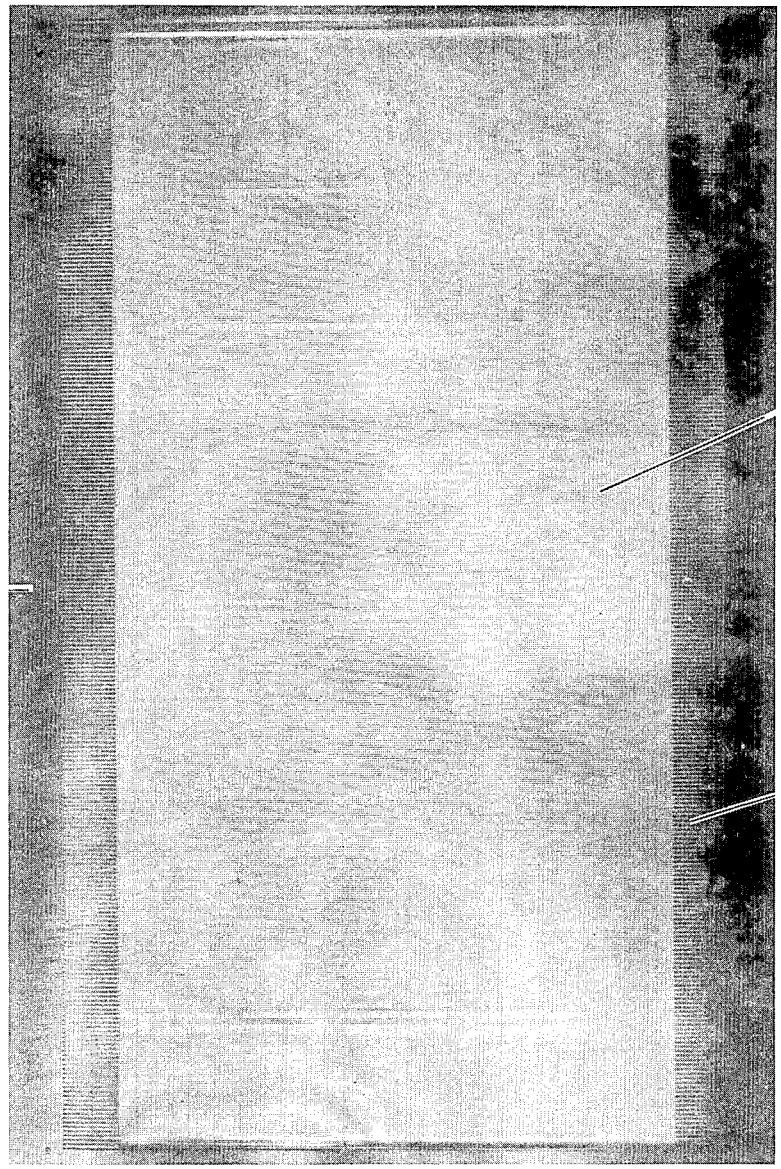
FIG. 1 is a photograph illustrating one embodiment of the mask of the instant invention.
Figure 2:
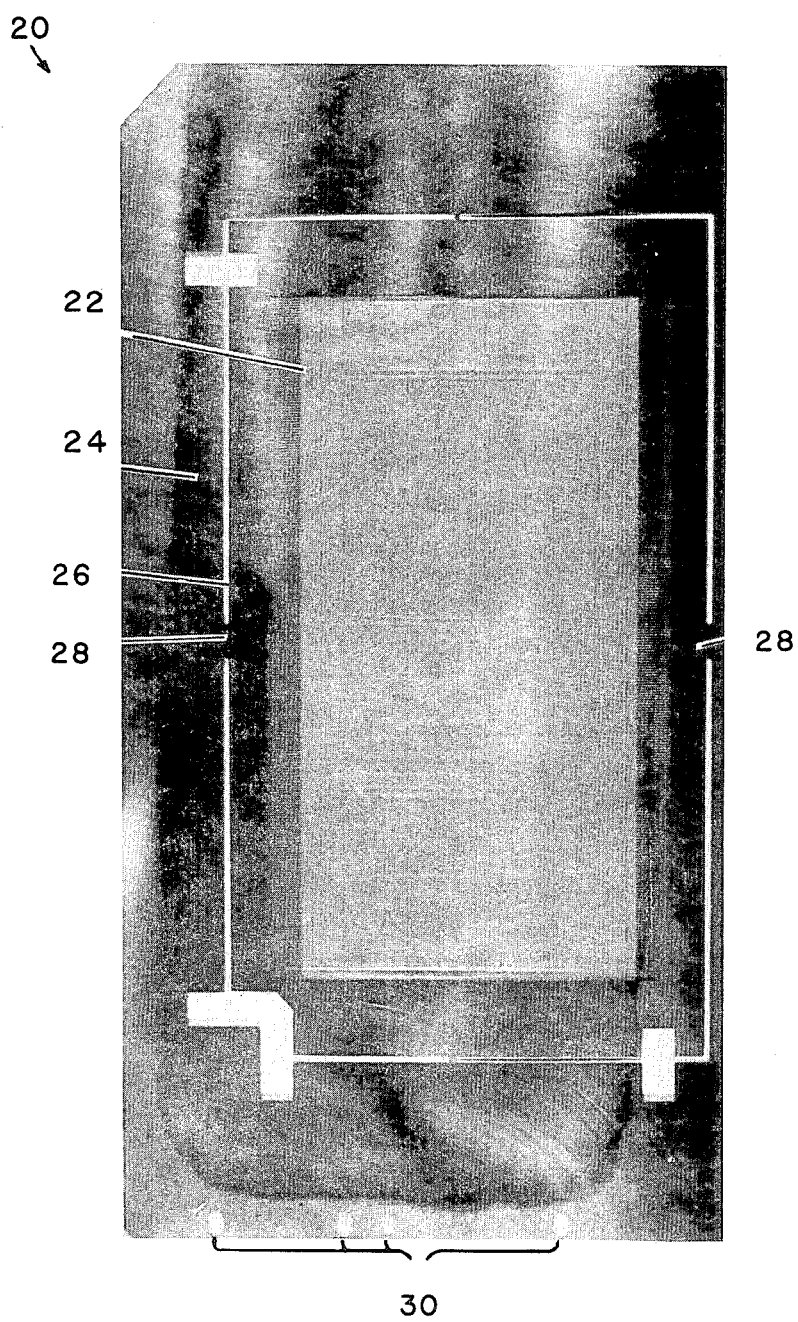
FIG. 2 is a photograph illustrating one example of a mask assembly for supporting a mask.

With particular attention to FIG. 1, there is illustrated a shadow mask 10 which is typically used in a deposition process to form electrode structures in a thin film EL device. Shadow mask 10 is comprised of a border portion 12, an electrode forming portion 14 and an electrode pad forming portion 16. Shadow mask 10 is made from the homogeneous piece of metal stock that has been etched using a photolithographic method. FIG. 2 illustrates a mask assembly 20 which is used here to support shadow mask 10. Mask assembly 20 is comprised of an outer mask portion 22, an inner mask portion 24 (which is shadow mask 10 in this particular embodiment), slot means 26 and connecting means 28. Mask assembly 20 is, however, an example of how a mask, such as shadow mask 10, can be supported adjacent to a substrate when a pattern is to be deposited on the substrate. FIG. 2 also illustrates mounting holes 30 which aid in supporting mask assembly 20 when used in a deposition process.

Figure 3:
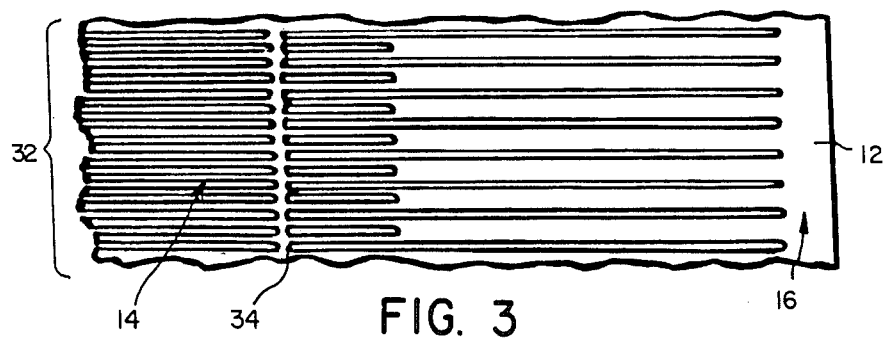
FIG. 3 is an enlarged sectional view of the mask illustrated in FIG. 1.
Figure 4:
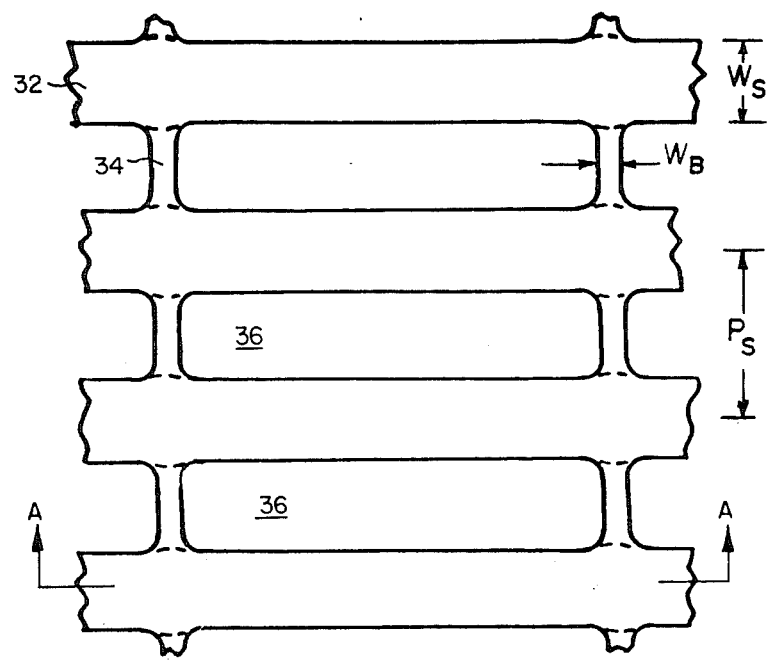
FIG. 4 is an enlarged sectional view of a portion of FIG. 3.
Figure 5:
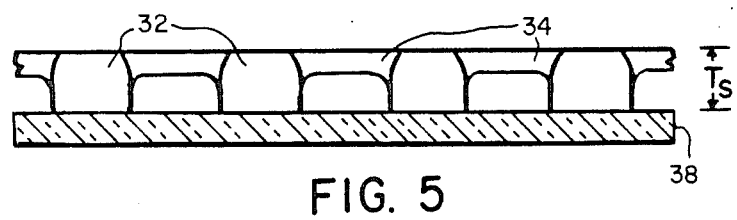
FIG. 5 is an enlarged illustration of a portion of the mask of FIG. 1 in operative contact with a substrate.

Referring now to FIGS. 3 through 5, these figures illustrate enlarged sections of mask 10 for purposes of illustrating the structural aspects of mask 10. FIG. 3 illustrates more closely border portion 12, electrode forming portion 14 and electrode pad forming portion 16. Mask 10 structurally is comprised of a plurality of metallic strips 32 and a series of interconnecting arched bridges 34, that serve to define a predetermined pattern of elongated apertures. Border portion 12 is disposed about and is in contact with metallic strips 32. FIG. 4 illustrates an enlarged version of such strips 32 with interconnecting bridges 34 and elongated apertures 36. FIG. 5 illustrates the manner in which strips 32 are in operative contact with a substrate 38 when shadow mask 10 is positioned in operative contact with substrate 38. In addition, interconnecting arched bridges 34 provide support for strips 32 while being spaced from the surface of substrate 38.

The plurality of metallic strips 32, as illustrated in FIGS. 1, 3-5, extend across mask 10 and are substantially parallel to each other. The series of metallic interconnecting bridges 34 also extend across mask 10 and are perpendicular to strips 32. Bridges 34 are in contact with strips 32 (see FIGS. 3-5) and along with the strips define a predetermined pattern of elongated apertures 36 (see FIG. 4). As seen in FIG. 4, substantially all of metallic strips 32 are of substantially equal thickness, $T_s$, and width, $W_S$. Metallic strips 32 of mask 10 also have a predetermined center to center pitch, $P_s$. Bridges 34 of mask 10 are also of substantially equal width, $W_B$, and thickness, $T_B$, the width and thickness being less than metallic strip thickness, $T_s$ (see FIG. 5).

In forming mask 10 a homogeneous piece of metal stock is etched using photolithographic type techniques to form the mask illustrated in FIGS. 1 and 3-5. In arriving at the structure illustrated in FIGS. 3-5 a differential etch is used which consists of etching half way through a metallic sheet with a pattern of bridges from one side, and half way through a metallic sheet with a metal pattern lacking bridges from the other side. This opens up the areas under and around bridges 34 with a structurally rounded profile (FIGS. 4 and 5). The half etched arched bridges allows deposition to occur beneath the bridges such that continuous, unbroken electrodes can be patterned in a single deposition. Because mask 10 is made from a single metal sheet, (see FIG. 1) it will not delaminate and the mask can be made of materials which thermally match the expansion properties of the substrate on which the thin film structures are to be deposited. In addition, the single metal mask can be made to be chemically resistant or to be magnetically attracted.

The rounded profile of the openings in the mask provides a strength advantage over masks made with a rectangular profile. This allows one to fabricate the masks with the smallest possible bridge width, enhancing the patterning performance of deposits made from the mask. Shadow mask 10 can provide a rounded profile to the shape of the material to be deposited on the substrate and will allow for a single, simple patterning process when compared to photolithography. In a preferred embodiment the metallic sheet is etched using photolithograhic methods to achieve shadow mask 10 having the following dimensions: strip thickness, $T_S$, of about 0.005 inches, strip width, $W_S$, of about 0.007 inch, a center to center pitch, $P_S$, for strips 32 of about 0.015 inch and bridge width, $W_B$ and thickness, $T_B$, in the range of about 0.0015 inch to about 0.0025 inch. Elongated apertures 36 illustrated in FIG. 4 have a width of about 0.008 inch.

Referring to FIGS. 1 and 3, electrode forming portion 14 of mask 10 has a predetermined number of electrodes per linear inch forming capability. In the preferred embodiment of the present invention, shadow mask 10 had the capability of forming 66 electrodes per linear inch on a substrate. Depending on the resolution requirements in a particular display panel, the number of electrodes per linear inch may vary. The higher the resolution (i.e., the greater number of electrodes per linear inch) the greater the number of metallic strips per linear inch required to achieve such a desired resolution. In addition, electrode pad forming portion 16 of mask 10 has about half the number of apertures as does electrode forming portion 14 of mask 10. In essence the metallic strips are staggered in length when approaching the electrode pad forming portion of the mask in order to create an alternating type pattern (see FIG. 3).

Referring to FIGS. 1, 2, 6A and 6B, a method for depositing a pattern of electrode structures for a thin film EL device having at least a substrate will be described. FIGS. 7A. 7B and 8 illustrate different views of electrode structures 70, on a substrate 72, that will result from using the method described herein for forming such electrode structures. Electrode structures 70 may be formed from a metallic material or from a transparent, electrically conductive material. In addition, electrode structures 70 may be formed directly on substrate 72 or on part of a thin film EL stack.

Figure 6A:
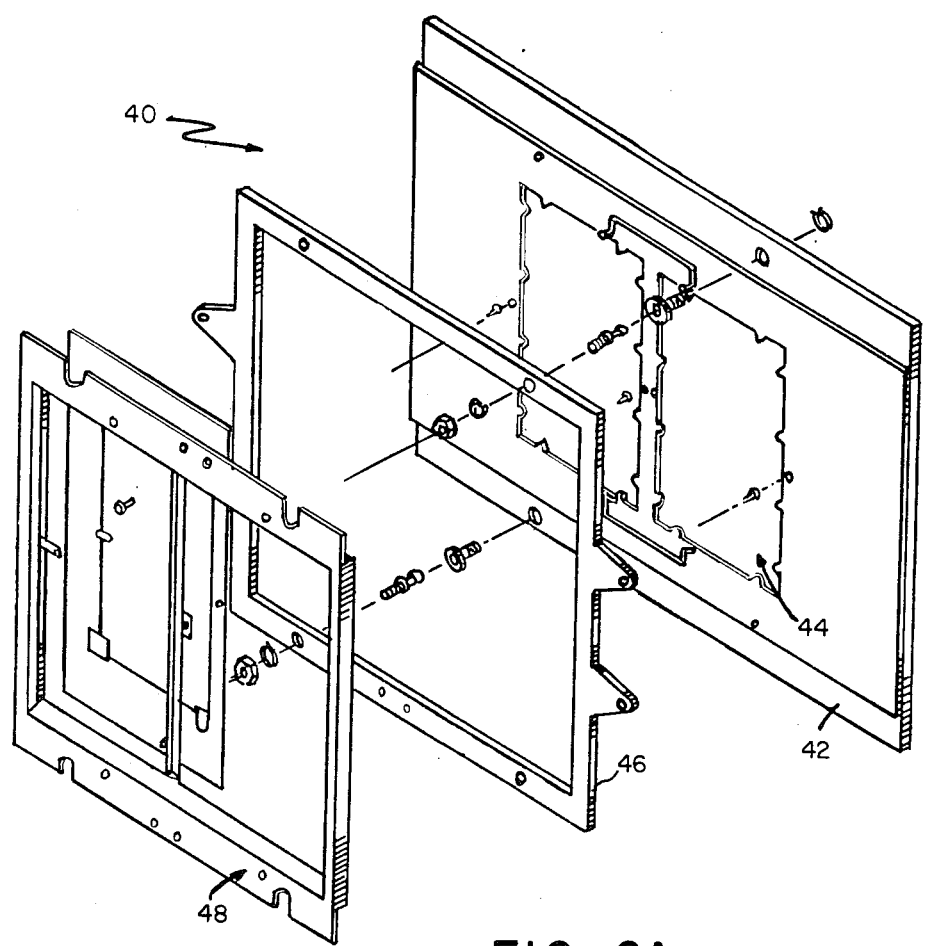
FIGS. 6A and 6B are examples of a mechanism for supporting the shadow mask against the substrate and placing such a mechanism in a sputtering system, respectively.
Figure 6B:
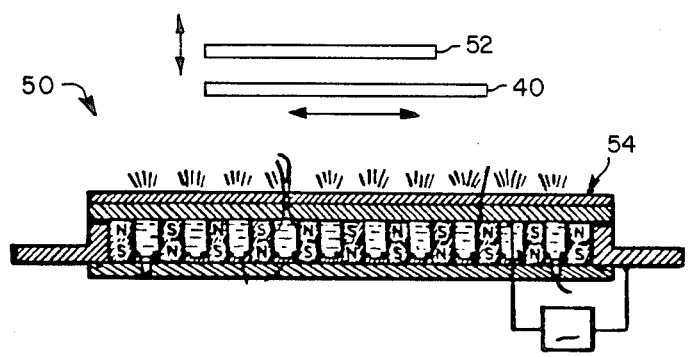
Figure 7A:
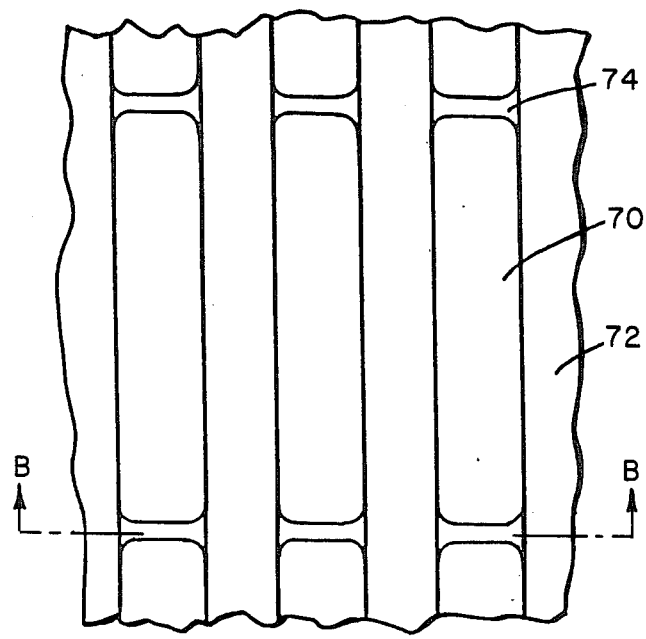
FIGS. 7A and 7B are enlarged top and side sectional of views of the deposited electrode structures.

Referring now to FIG. 6A, there is illustrated a mask registration mechanism 40 for supporting mask assembly 20 illustrated in FIG. 2 and in particular to maintain inner mask portion 24 (which could be shadow mask 10 in this particular instance) adjacent to and in operative contact with a substrate on which the thin film structures are to be deposited. Mechanism 40 is comprised of a substrate carrier 42, which supports (in this case) two substrates 44, a mask frame holder 46 and a mask frame 48. In FIG. 6B a deposition system is illustrated including mechanism 40, containing substrates 44 and mask 10, that is exposed to a vacuum type deposition apparatus 50 on one side of substrate 44. On the other side of mechanism 40 there is shown a magnet 52 which is to be positioned adjacent to and in operative contact with a portion of mechanism 40 in order to hold inner mask portion 24 against substrate 44. For a more detailed description of the type of deposition apparatus 50 illustrated in FIG. 6B, refer to U.S. Pat. No. 4,437,966 issued to Hope et al, the subject matter of which is hereby incorporated by reference.

In accordance with the teachings of the present invention, a method of depositing a pattern of electrode structures for a thin film device having at least a substrate will be herein described. The aforementioned method comprises the steps of providing shadow mask 10 having a plurality of metallic strips 32 which extend across mask 10 that are substantially parallel to each other and a series of metallic interconnecting bridges 34 (see FIG. 4) which extend across mask 10 that are perpendicular to and are in contact with strips 32, strips 32 and bridges 34 defining a predetermined pattern of elongated apertures 36. In the next step, mask 10 is positioned on one side of a substrate 44 (see FIG. 6A). In the next step, a magnet 52 is positioned adjacent the side of substrate 44 opposite mask 10 such that strips 32 are held in operative contact with substrate 44 (e.g., see FIG. 5). Finally, and as partially illustrated in FIG. 6B, an electrode material 54 is vacuum deposited through mask 10 through apertures 36 by using a deposition apparatus 50, thereby forming electrode structures on the substrate (e.g., see FIG. 7A). The electrode structures are completely deposited by a single pump down step, therefore the mask need not be realigned in order to form continuous, unbroken electrodes.

The mask used in this method is as described in mask 10. The vacuum depositing step of the described method principally involves sputtering but may also include vapor deposition or chemical vapor deposition. Deposition of the electrode material will occur beneath the arched bridges 34 of the mask resulting in a pattern deposition (See FIG. 7A) that does not readily reveal (to the naked eye) the presence of bridges 74 in the structures because sufficient material is coated beneath to provide cosmetic and electrical continuity between areas separated by bridges 74 (see FIGS. 7A and 8). The electrode material of said method may include any electrode material used in a thin film device. In the present invention the electrode material includes a transparent electrically conductive or metal oxide material and a metallic material. The transparent metal oxide material includes indium tin oxide or tin oxide while the metallic material includes aluminum or nickel. The method described herein for depositing electrode structures 70 on a substrate is performed in an in-line system and at no time does the system require breaking vacuum. The method described herein may also be used in a system which is not in line, but as in such systems the risk involved is in contaminating the layers to be deposited on the substrate. Accordingly, the instant invention uniquely provides for a shadow mask and a method of utilizing such a shadow mask to produce electrode structures within a thin film electroluminescent device with only a single deposition step.

Figure 7B:
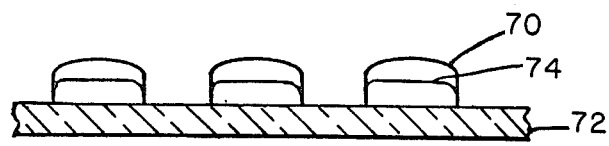
Figure 8:
FIG. 8 is an enlarged side view of the rounded electrode structures after deposition.

As illustrated in FIGS. 7A, 7B, and 8, the utilization of shadow mask 10 and the method described for depositing electrode structures 70 provide for a rounded profile to the shape of the electrode structures 70 and allow for a single, simple patterning process when compared to photolithography. Additional advantages to using a shadow mask as described herein and the method of depositing electrode structures include substantially eliminating both the shorting problem between electrodes and electrical breakdown due to the absence of sharp edges at the surface which are normally produced in electrode structures formed by using photolithography. The aforementioned mask and method in addition, simplifies manufacturing of thin film devices having such thin film structures and lowers the incidence of contamination in the thin film device. Finally, the teachings of the present invention provide for long, narrow electrode structures for particular use in electroluminescent devices, while maintaining electrical conductivity along the electrode structure. The mask also provides precise patterning to a deposit at process temperature (e.g., about 100° Celsius) without destruction of the mask itself.

While there have been shown and described what our at present considered the preferred embodiments of the invention, it will be obvious to one skilled in the art that various changes and modifications may be made therein without departing from the scope of the invention as defined by the appended claims.

What is claimed is:

1. A mask for the patterning of electrode structures for a thin film device having at least a substrate, said mask comprising
   a plurality of metallic strips which extend across said mask are are substantially parallel to each other, each strip having an equal thickness, $T_S$, and a first major surface and an opposed second major surface, the second surface being adapted for disposition upon solid substrate;
   a series of metallic interconnecting bridges which extend across said mask and are perpendicular to said strips and said bridges defining a predetermined pattern of elongated apertures having rounded profiles, each of said bridges having an equal thickness, $T_B$, and a first surface and an opposed second surface, the first surface of each bridge and the first major surface of each strip being coplanar, and the thickness, $T_S$, of each strip being greater than the thickness, $T_B$, of each bridge, whereby an opening is provided between the bridge and the substrate when the mask is disposed against the substrate.

2. The mask according to claim 1 wherein each of said strips has a thickness of about 0.005 inch.

3. The mask according to claim 2 wherein each of said strips has a width of about 0.007 inch.

4. The mask according to claim 1 wherein said metallic strips have a predetermined center to center pitch.

5. The mask according to claim 4 wherein said center to center pitch is about 0.015 inch.

6. The mask according to claim 1 wherein said predetermined pattern of apertures comprise an electrode forming portion and an electrode pad forming portion.

7. The mask according to claim 6 wherein said electrode forming portion has a predetermined number of electrodes per linear inch forming capability.

8. The mask according to claim 7 wherein said number of electrodes per linear inch is about 66.

9. The mask according to claim 6 wherein said electrode pad forming portion has about half the number of apertures as does said electrode forming portion of said mask.

10. The mask according to claim 9 wherein each of said apertures has a width of about 0.008 inch.

11. The mask according to claim 1 wherein said thin film device is an electroluminescent device.

12. The mask of claim 1 wherein each of the metallic strips are of substantially equal width.

13. The mask of claim 1 wherein the mask further includes a border portion disposed about and in contact with the plurality of metallic strips.

14. The mask of claim 1 wherein each of the bridges are of substantially equal width.

15. The mask of claim 14 wherein the width of the bridges is less than the thickness of the strips.

16. The mask according to claim 14 wherein said bridge width and thickness are in the range of about 0.0015 inch to about 0.0025 inch.

17. A method of depositing a pattern of electrode structures for a thin film device having at least a substrate, said method comprising the steps of:

providing a mask having a plurality of metallic strips which extend across said mask that are substantially parallel to each other, each strip having a thickness, $T_S$, and a first major surface and an opposed second major surface, the second surface being adapted for disposition upon said substrate, and a series of metallic interconnecting bridges which extend across said mask that are perpendicular to said strips and are in contact with said strips, said strips and bridges defining a predetermined pattern of elongated apertures having rounded profiles, each of said bridges having a thickness, $T_B$, and a first surface and an opposed second surface, the first surface of each bridge and the first major surface of each strip being coplanar, and the thickness, $T_S$, of each strip being greater than the thickness, $T_B$, of each bridge, whereby an opening is provided between the bridge and the substrate when the mask is disposed against the substrate;

positioning said mask against one side of said substrate;

positioning a magnet adjacent the side of said substrate opposite said mask such that the second surface of each of said metallic strips is held in operative contact with said substrate; and vacuum depositing electrode material through said apertures of said mask, thereby forming said electrode structures on said substrate, the deposited material having a rounded profile.

18. The method according to claim 17 wherein substantially all of said metallic strips of said mask are of substantially equal width.

19. The method according to claim 18 wherein said metallic strips of said mask have a predetermined center to center pitch.

20. The method according to claim 18 wherein substantially all of said bridges of said mask are of substantially equal width, said width being less than said metallic strip thickness.

21. The method according to claim 17 wherein said pattern of apertures comprise an electrode forming portion and an electrode pad forming portion.

22. The method according to claim 17 wherein said mask further includes a border portion disposed about and in contact with said plurality of metallic strips.

23. The method according to claim 17 wherein said step of vacuum depositing includes sputtering, vapor deposition or chemical vapor deposition.

24. The method according to claim 17 wherein said electrode material includes a transparent electrically conductive material.

25. The method according to claim 24 wherein said electrically conductive material includes indium tin oxide.

26. The method according to claim 24 wherein said electrically conductive material includes tin oxide.

27. The method according to claim 17 wherein said electrode material includes a metallic material.

28. The method according to claim 27 wherein said metallic material includes aluminum.

29. The method according to claim 27 wherein said electrode material includes nickel.

30. The method according to claim 17 wherein said method of depositing said electrode structures is performed in an in-line system.

* * * * *